US009355698B2

(12) United States Patent
Naaman et al.

(10) Patent No.: US 9,355,698 B2
(45) Date of Patent: May 31, 2016

(54) MEMORY AND LOGIC DEVICE AND METHODS FOR PERFORMING THEREOF

(71) Applicants: YEDA RESEARCH AND DEVELOPMENT CO. LTD., Rehovot (IL); YISSUM RESEARCH DEVELOPMENT COMPANY OF THE HEBREW UNIVERSITY OF JERUSALEM LTD., Jerusalem (IL)

(72) Inventors: Ron Naaman, Yarkona (IL); Yossef Paltiel, Maskeret Batya (IL); Sivan Kober, Rehovot (IL); Gilad Gotesman, Rehovot (IL)

(73) Assignees: YEDA RESEARCH AND DEVELOPMENT CO. LTD., Rehovot (IL); YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 0 days.

(21) Appl. No.: 14/385,006

(22) PCT Filed: Mar. 13, 2013

(86) PCT No.: PCT/IL2013/050228
§ 371 (c)(1),
(2) Date: Sep. 12, 2014

(87) PCT Pub. No.: WO2013/136331
PCT Pub. Date: Sep. 19, 2013

(65) Prior Publication Data
US 2015/0049542 A1 Feb. 19, 2015

Related U.S. Application Data

(60) Provisional application No. 61/609,976, filed on Mar. 13, 2012.

(51) Int. Cl.
*G11C 11/00* (2006.01)
*G11C 11/16* (2006.01)
(Continued)

(52) U.S. Cl.
CPC .............. *G11C 11/16* (2013.01); *B82Y 10/00* (2013.01); *G11C 11/5607* (2013.01); *G11C 13/0014* (2013.01); *G11C 13/0016* (2013.01); *G11C 13/0019* (2013.01); *H01L 43/10* (2013.01); *H03K 19/0008* (2013.01); *G11C 11/161* (2013.01); *H01L 27/285* (2013.01); *H01L 29/0665* (2013.01); *H01L 51/0093* (2013.01); *H01L 51/0595* (2013.01)

(58) Field of Classification Search
CPC ...................................................... G11C 11/161
USPC ........................................................ 365/158
See application file for complete search history.

(56) References Cited

U.S. PATENT DOCUMENTS 7,906,345 B2 * 3/2011 Wang .................. B82Y 5/00
428/403
2007/0287015 A1 12/2007 Naaman et al.
(Continued)

FOREIGN PATENT DOCUMENTS

EP 2492984 A2 8/2012
WO 03099411 A1 12/2003

OTHER PUBLICATIONS

R.Naaman et al: "Chiral-Induced Spin Selectivity Effect," Journal of Physical Chemistry Letters, 3:16: 2178-2187, (Jul. 2012).
(Continued)

*Primary Examiner* — Son Mai
(74) *Attorney, Agent, or Firm* — Browdy and Neimark, PLLC

(57) ABSTRACT

In accordance with one exemplary embodiment of the present technique, there is disclosed a spins selective device, including a first layer comprising a ferromagnetic material. The spin selective device further includes a second layer coupled to the first layer. The second layer includes at least one molecule having a specified chirality, such that when an electrical current flows between the first layer and the second layer one or more regions of the ferromagnetic material become magnetically polarized along a certain direction.

30 Claims, 9 Drawing Sheets

(51) Int. Cl.
- B82Y 10/00 (2011.01)
- G11C 11/56 (2006.01)
- G11C 13/00 (2006.01)
- H01L 43/10 (2006.01)
- H03K 19/00 (2006.01)
- H01L 51/00 (2006.01)
- H01L 51/05 (2006.01)
- H01L 29/06 (2006.01)
- H01L 27/28 (2006.01)

(56) References Cited

U.S. PATENT DOCUMENTS

| | | |
|---|---|---|
| 2009/0059659 A1 | 3/2009 | Inokuchi et al. |
| 2010/0102405 A1 | 4/2010 | Lou |
| 2012/0223294 A1 | 9/2012 | Guhler et al. |

OTHER PUBLICATIONS

Zouti et al: "Spin Specific Electron Conduction through DNA Oligomers", Nano Letters, 11:11:4652-4655 (Nov. 2011).

Gutierrez et al: "Spin-selective transport through helical molecular systems" Physical Review B, 85: 8:0814041-0814044 (Feb. 2012).

Gohler et al: "Spin Selectivity in Electron Transmission Through Self Assembled Monolayers of Double-Stranded DNA" Science, 331:6019:894-897 (Feb. 2011).

Chen et al: "Time-resolved measurement of spin-transfer-driven ferromagnetic resonance and spin torque in magnetic tunnel junctions", Nature Physics, 7: 6:496-501 (Feb. 2011).

Kumar et al: "A device for measuring spin selectivity in electron transfer", Phys. Chem. Chem. Phys., 15:18357-18362 (Sep. 2013).

International Search Report dated Jun. 25, 2013, in corresponding application No. PCT/IL2013/050228.

* cited by examiner

MEMORY AND LOGIC DEVICE AND METHODS FOR PERFORMING THEREOF

This Application claims the benefit of priority under 35 U.S.C. §119(e) of a provisional application 61/609,976, entitled "Magnetic Memory with No Permanent Magnet," incorporated herein by reference in its entirety.

TECHNOLOGICAL FIELD

The present invention relates to memory and logic devices, more particularly the present invention relates to magnetic memory and logic devices utilizing spin filters.

REFERENCES

References considered to be relevant to the background of the presently disclosed subject matter are listed below:

European patent application No. 2492984 A2 relates to a methods and devices for providing currents of spin-polarized electrons by utilizing highly polarized electrons ejected from surfaces coated with self-assembled monolayers of double stranded DNA. Similarly, the reference discloses that self assembled dsDNA monolayers can be prepared by depositing dsDNA on gold substrates. Further, according to the disclosure, photoelectrons are ejected by a UV laser having linearly or circularly polarized light from which the polarization of the ejected electrons is observed.

U.S. Publication No. 2012/0223294 relates to a method and device for obtaining spin-polarized electrons which can be integrated and used in large scale integrated circuits, printed circuits and/or spintronic applications in general. Further, the disclosure relates to a methods and devices for detecting spin-polarized electrons which can be employed without the need of complex and error-prone equipment, and for achieving high efficiency in spin selectivity. Accordingly, the disclosure relates to at least one monolayer deposited upon said substrate. The monolayer comprises asymmetrical molecules, and is adapted to filter electrons travelling from the substrate through the one monolayer such that electrons exhibiting a predetermined spin can pass therethrough.

U.S. Publication No. 2007/0287015 relates to a nanoscopic structure having a paramagnetic and spin selective material for spintronics. The structure comprises organic molecules absorbed on and extending from a surface of an electrically conductive film, such that the organic molecules contain a binding group forming a chemical bond to said surface and form a self-assembled monolayer on said surface. Hence, the disclosed structure can be used in a data carrier of a segmented device having spaced-apart segments with magnetic moment, or a spin filter device.

Acknowledgement of the above references herein is not to be inferred as meaning that these are in any way relevant to the patentability of the presently disclosed subject matter.

BACKGROUND

Modern computing systems generally make use of memory devices, for example, memory device employing dynamic random-access memory (DRAM), or static random-access memory (SRAM) existing in various computing platforms. For instance, DRAM operates by storing individual bits on a separate capacitor of an integrated circuit, while in SRAM, each bistable circuit stores individual bits of data. Notwithstanding their prevalent usage, such memory devices are generally becoming harder to operate, mainly due to the increase of energy such devices consume (e.g., wring/reading currents, refresh rates, etc.). In addition, because such memories are volatile, upon turning a computing system on, it takes relatively long time to transfer information from non-volatile memory not located on the chip to the DRAM and SRAM. In addition, the ever growing demand to miniaturize and integrate such devices beyond present day VLSI fabrication scales, i.e., 22 nanometers, remains a significant and an ongoing challenge for practitioners in the field. Having devices with no delay in operation upon turning on will widen computer applications and enables saving energy, since the computers will not need to be "on" to ensure fast response.

Indeed, to the extent such the aforementioned shortcomings are manifested in every day computing systems, the execution and implementation of computer applications and programs is progressively becoming energy inefficient and costly. To address some of these challenges, existing universal memory technologies, such as magnetic memory (MRAM) and spin-transfer torque based memory (STT-RAM), i.e., technologies based on inorganic spin-filters, have been recently proposed. For instance, memory systems utilizing MRAM generally require a permanent magnetic layer to be separated by a thin isolating non-magnetic layer from another ferromagnetic layer (also termed "free layer"), which can further be magnetized with polarization either parallel or anti-parallel to the direction of magnetization of a permanent magnet. By further example, in systems employing STT-RAM, the magnetization of the ferromagnetic free layer occurs by transferring specific electron spin onto the free layer. Despite their advantages, however, such technologies still require the use of a permanent magnet, while operating under relatively high current requirements for magnetizing the free layer. In addition, devices employing the above technologies remain notably sensitive to temperature variations, considered to be a significant challenge as well. Although research and development is on-going for addressing these challenges, the growing reliance on data storage and memory systems is expected to manifest as a limiting factor in overall computing performance.

GENERAL DESCRIPTION

Exemplary embodiments of the present invention pertain to memory and logical device utilizing spin filters made up of organic chiral molecules for exhibiting the chiral-induced spin selectivity (CISS) effect, as recently established experimentally and theoretically. While the present disclosure, as provided herein, includes a rather cursory discussion of the CISS effect, a comprehensive theoretical and experimental review of the CISS effect can be found in a publication, entitled: "Chiral-Induced Spin Selectivity Effect," published in The Journal of Physical Chemistry Letters, and incorporated herein by reference in its entirety.

Further, exemplary embodiments of the present invention relate to one or more memory and/or logical devices made up of layered structures, including ordered monolayer films of chiral organic molecules. Such chiral molecules are disposed on a surface on which the molecules act as electron spin filters at room temperature. Such electron spin filters can be disposed on one or more free ferromagnetic layers, whereby electrons emanating from such chiral spin filters can impart (through the spin transfer torque-STT) their selected spin onto the nano-particles in the free ferromagnetic layer. In so doing, the spin filtered electrons may alter the spin polarization of the free layer, thereby storing one or more bits of data (e.g., 0, 1). Such bits can be read from the free layer at a later time by passing an electrical current through the free layer to measure its resistivity, as may be dependent on the spin polarization of the free layer.

Hence, in so doing, the disclosed embodiments of the memory and/or logical devices are adapted to operate while not requiring the use of a permanent magnet. Furthermore, because spin selectivity of the disclosed chiral molecules exceeds by at least one order of magnitude spin selectivity of conventional solid-state spin injectors, that is, the amount of power required for operating such devices is significantly lower than conventional devices. Advantageously, these and other features, as described further below, can be implemented to provide inexpensive, high density universal memory on-chip, as well as, provide an ability to combine logic and memory capabilities on a single device. Such capabilities may contribute to overall computing power, as implemented in modern-day execution of large routines used, for example, in graphics and image recognition.

Hence, in accordance with one exemplary embodiment of the present technique, there is disclosed a spins selective device, including a first layer comprising a ferromagnetic material. The spin selective device further includes a second layer coupled to the first layer. The second layer includes at least one molecule having a specified chirality, such that when an electrical current flows between the first layer and the second layer one or more regions of the ferromagnetic material become magnetically polarized along a certain direction.

In accordance with other aspects of the present technique, there is disclosed a method of operating a memory cell, including receiving an electrical current by first layer comprising ferromagnetic material, and receiving the electrical current by a second layer coupled to the first layer. In accordance with the present technique, the second layer comprises a plurality of molecules having a specified chirality, and wherein the chirality defines spin polarization of one or more regions of the ferromagnetic material based on the electrical current.

In accordance with other aspects of the present technique, there is disclosed a logic cell. The logic cell includes a first layer including a ferromagnetic material, and a second layer coupled to the first layer. In accordance with the present technique, the second layer includes comprises a plurality of molecules comprising a first specified chirality and a second specified chirality, and wherein each of the specified chiralities is adapted to determine spin polarization of one or more regions of the ferromagnetic material when an electrical current flows between the first layer and the second layer.

Other aspects of the present invention relate to embodiments in which memory reading device is disclosed. Accordingly, the disclosed memory reading device is formed of elements similar to those mentioned with regard to the above spin selective device. The disclosed memory reading device further includes a layered structure having a plurality of chiral molecules, disposed over a metal layer, further overlaying a ferromagnetic layer.

The disclosed memory reading device operates by subjecting the device to laser light for ejecting photoelectrons from the molecules, thereby creating electron-hole pairs within the substrate. The newly created holes become spin filtered, as those traverse the underlying chiral layer (as provided by CISS effect), eventually migrating to the underlying metal layer. Accordingly, depending on the magnetization of the underlying ferromagnetic layer and the chirality of the migrated holes, a voltage between the metal and ferromagnetic layer can be measured to provide an indication as to the direction of magnetization of the ferromagnetic layer. Hence, the ferromagnetic layer can applied to a magnetic memory device, such as a hard disk, which can be read utilizing the measured voltage. Thus, regions within the ferromagnetic layer having a magnetization (as would be determined by a memory device, i.e., disk) aligned parallel with spin of those holes migrated to the metal layer will provide a distinctively different voltage reading from those voltage reading acquired when magnetization of regions within the ferromagnetic layer are aligned anti-parallel to the holes migrated to the metal when the device is illuminated by laser light. Hence, operation of the disclosed device is based on intrinsic photo-induced spin-polarized electron transfer processes occurring at the nanometer scale, thus, eliminating a need for use of external electrical current sources.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
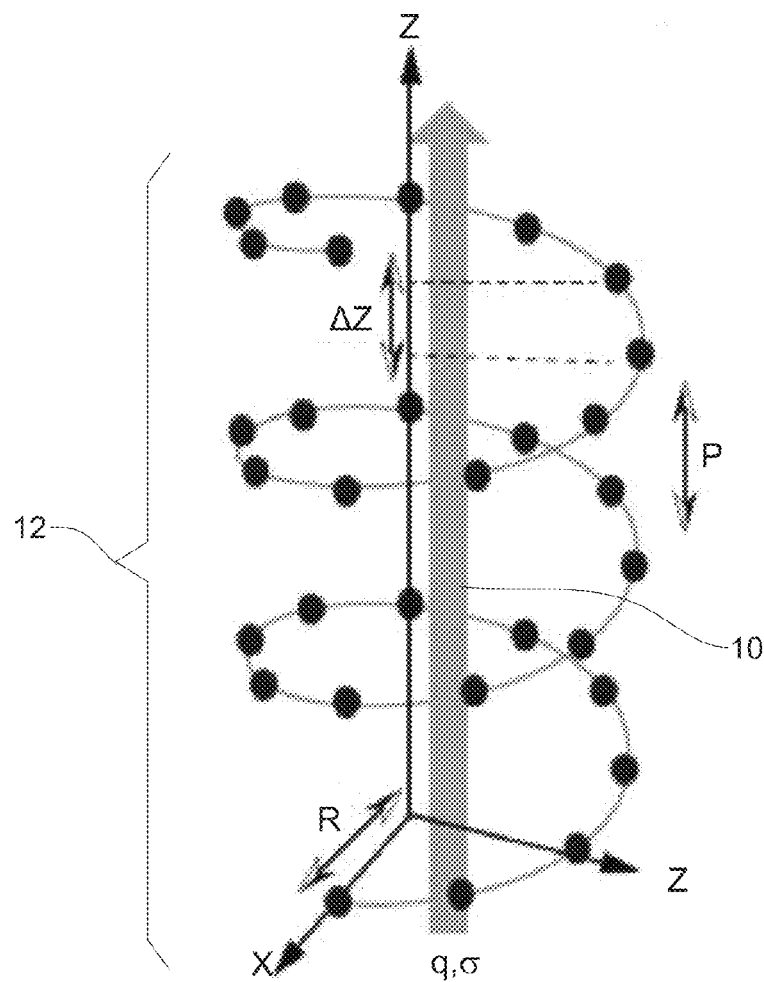
FIG. 1 illustrates a trajectory of a particle moving through a charge distribution, in accordance with an embodiment of the present technique.

Turning now to the figures, FIG. 1 illustrates a trajectory 10 of a charged particle moving through a molecule having a helical charge distribution 12, in accordance with an embodiment of the present technique. The charged particle 10 may be an electron, further characterized by its intrinsic spin $\vec{\sigma}$ and momentum P. The charge distribution of the helix 12, as illustrated by FIG. 1, may be that of an organic molecule, such as a DNA molecule or other helical molecules, made up of, for example, certain nucleic acids, peptides, helicenes, polythiophene, and the like. The helical charge distribution 12 is further typified by a helix radius R, pitch p and the spacing of charges disposed along the longitudinal axis of the molecule 12. Chiral molecules, such as the molecule 12, may further be characterized certain spatial and geometrical asymmetries, otherwise known as chirality or handedness. Thus, for example, the helical structure of molecule 12 can render it either as a left handed chiral molecule, or a right handed chiral molecule. While exemplary embodiments of the present technique may utilize helical chiral molecules, the present technique may also be applicable to other types of chiral molecules, i.e., those not necessarily possessing a helical structure.

Accordingly, a charged particle, i.e., an electron, moving through a chiral molecule, such as molecule 12, experiences certain electromagnetic forces, as may be characterized by a coupling formed between the charge, spin, and velocity, and the surrounding electromagnetic fields arising from the molecular distribution of the molecule 12. As shown in a publication, entitled: "Chiral-Induced Spin Selectivity Effect," published in The Journal of Physical Chemistry Letters, and incorporated herein by reference in its entirety, movement of the particle 10 through chiral molecules, such as those formed by the molecule 12, gives rise to a chiral-induced spin selectivity (CISS) effect. According to the CISS effect, for example, an electron experiencing a chiral potential (of a given handedness, e.g., right handed), whereby its momentum and intrinsic spin are oriented anti-parallel to one another, will propagate more freely through the molecule, than an electron with spin and momentum directed parallel to one another.

Figure 2:
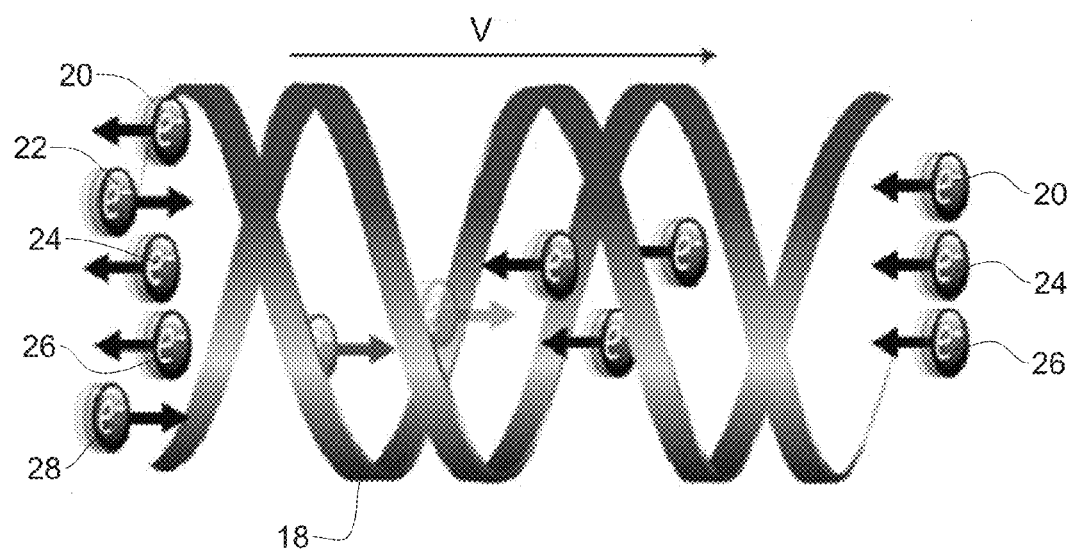
FIG. 2 illustrates chiral-induced spin selectivity, in accordance with an embodiment of the present technique.

FIG. 2 further illustrates chiral-induced spin selectivity, in accordance with an embodiment of the present technique. In an exemplary embodiment, charged particles, i.e., electrons 20, 22, 24, 26 and 28, are passed through a doubled stranded molecule 18, such as DNA molecules, having a specified chriality, for example, right handed chirality (Those skilled in the art will appreciate that the labels ascribed to the illustrated electrons is merely for the sake of illustrating basic physical concepts). Accordingly, the electrons 20-28 may form part of an electrical current formed across the double stranded molecule 18. As illustrated, the particles 20-28 all move to the right with particles 20, 24 and 26 having a spin vector (as indicated by the attached arrow) directed to the left, that is, anti-parallel to the direction of movement of the particles 20, 24, and 26, while the particles 22 and 28 have a spin vector oriented parallel to the direction of movement of the particles. According to the CISS effect, particles 20, 26 and 28 posses a significantly higher probability in traversing the length of the molecule 18, than the particles 22 and 28. In other words, the molecule 18 having a specified chirality may act to filter those particles moving along a certain direction and which have their spin oriented relative to their velocity in a prescribed manner, i.e., anti-parallel for the case illustrated by FIG. 2. By the same token and in accordance with the CISS effect, particles having their spin aligned parallel to their direction of movement will possess a greater chance in traversing a left handed chiral molecule than those charged particles having the aforementioned vectors aligned anti-parallel to one another.

Figure 3:
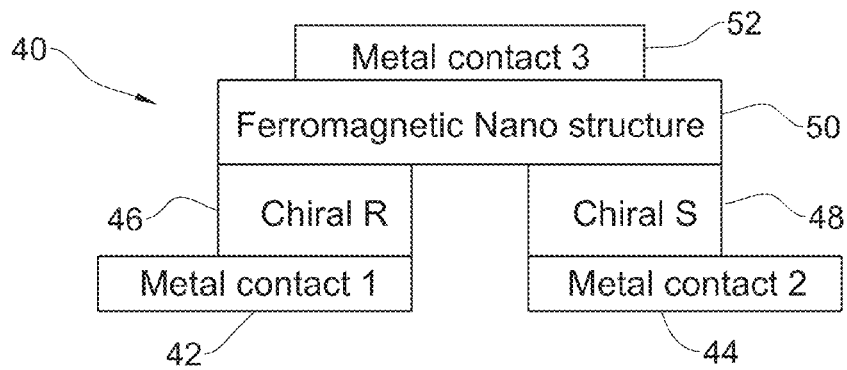
FIG. 3 illustrates a block diagram of a memory device 40, in accordance with an embodiment of the present technique.

Hence, chiral molecules along with the foregoing CISS effect can serve as a filtering device though which the particle's spin can be selected for further use, as illustrated by FIG. 3. Accordingly, FIG. 3 depicts a block diagram of a memory device 40, in accordance with an embodiment of the present technique. The device 40 utilizes chiral molecules and the CISS effect for writing data on and/or reading data from a ferromagnetic (free) mono layer made up of nano-particles. Hence, the device 40 is made up of two bottom metal contact layers 42 and 44, over which chiral layers 46 and 48 are disposed, respectively. Each of the chiral layers 46 and 48 may be made up of one or more of chiral molecules, such as synthetic DNA molecules, or other molecules having desired helical structures, for example, such as those found in certain nucleic acids, peptides, helicenes, polythiophene, and the like. In the illustrated embodiment, the chiral layer 46 may be, for example, that of an R (right) type, while the chiral layer 48 may be that of an S (left) type. Those skilled in the art will appreciate that the aforementioned R/S enantiomers correspond to each chiral center R or S according to a system by which its substituents are each assigned a priority, according to the Cahn-Ingold-Prelog priority rules (CIP), based on atomic number.

As further illustrated, the chiral layers 46 and 48 are each overlaid by a free ferromagnetic layer 50 made up of numerous nano-particles desirably sized around 50 nano-meters alternatively, the layer 50 may be made up of ferromagnetic thin films for maintaining the ferromagnetic characteristic of the layer 50. Hence, ferromagnetic layer 50 is adapted to be magnetized so that particles/domains disposed therein can become aligned along a certain chosen direction. Further, on top of layer 50 there is disposed metal layer 52, adapted to be used in conjunction with bottom metal layers 42 and 44 for passing current, i.e., charged particles, through the device 40 for read and/or write operations.

Hence, the device 40 can be utilized along with the CISS effect to write and store memory bits on the ferromagnetic layer 50 by passing the current of electrons between either layer 42 or 44 through the ferromagnetic structure 50 and the top metal layer 52. For example, a writing operation can be accomplished by using the memory device 40 by establishing an electrical current in which electrons flow from the bottom metal layer 42 to the upper metal 52. In so doing, the chiral R layer acts a spin filter so as to transfer only those electrons whose spin lies anti-parallel to the upward flow of movement of the upward moving electrons. Once such filtered electrons enter the ferromagnetic free layer 50, the electrons will impart their selected spin (as achieved through the spin transfer torque effect) onto the nano-particles making up the layer 50, so as to magnetize the layer 50 in a particular direction. In accordance with the present technique, spin polarization of nano-particles within layer 50 can be altered so as to write one or more bits of data (e.g., 0, 1) on the layer 50.

Similarly, the spin polarization of the ferromagnetic layer can be altered to attain a second state of magnetization above by establishing an electrical current between the layers 44 and 52, in which chiral S layer 48 may filter only those electrons having spin laying parallel to the upward direction of movement of the electrons. Hence, such filtered electrons will impart, i.e., transfer, their spin to the ferromagnetic layer 50, such that the nano-particles within the layer 50 may become spin oriented opposite to when current flows between layers 42 and 52, as described above. Still yet, a third state of magnetization can be achieved by passing currents through both the Chiral layers R and S such that the ferromagnetic layer 50 attains no net magnetization, as the electrons filtered by each of the layers 46 and 48 will impart their opposite spin on the ferromagnetic layer 50, thereby cancelling each other out.

Hence, as described above, the device 40 may attain three (3) states of magnetization, i.e., 1, −1, 0, corresponding to the direction of magnetization of the layer 50, i.e., magnetized in a first direction, magnetized opposite to the first direction, or not magnetized, respectively. As further described below, the three states of magnetization, as realized by the device 40 (and by those similar to it—see below FIGS. 4, 5, 8 and 9), can be used in various logic operations such as, for example, XOR operations implemented in standard computing logic.

Further, in accordance with the above writing operations, the device 40 can further be read so as to retrieve the data bits stored on the device 40. Hence, reading operations of the device 40 may be accomplished by passing low currents between either of the metal layers 42 or 44 and the metal layer 52. In so doing, if the free ferromagnetic layer 50 is spin polarized in a direction equivalent to that of the spin transferred, i.e., spin direction of the filtered electrons, the illustrated configuration will yield a relatively high resistivity measurement as opposed to when the magnetization is directed opposite to the direction of the spin transferred. Advantageously, currents used to read the device 40 are significantly lower than those used to write data on the device 40. Further, it should be borne in mind that the memory cell, as formed by the device 40, is exemplary and that the present technique contemplates incorporating numerous such cells in larger scaled devices for providing robust memory capabilities compatible with modern and future computing requirements.

Figure 4:
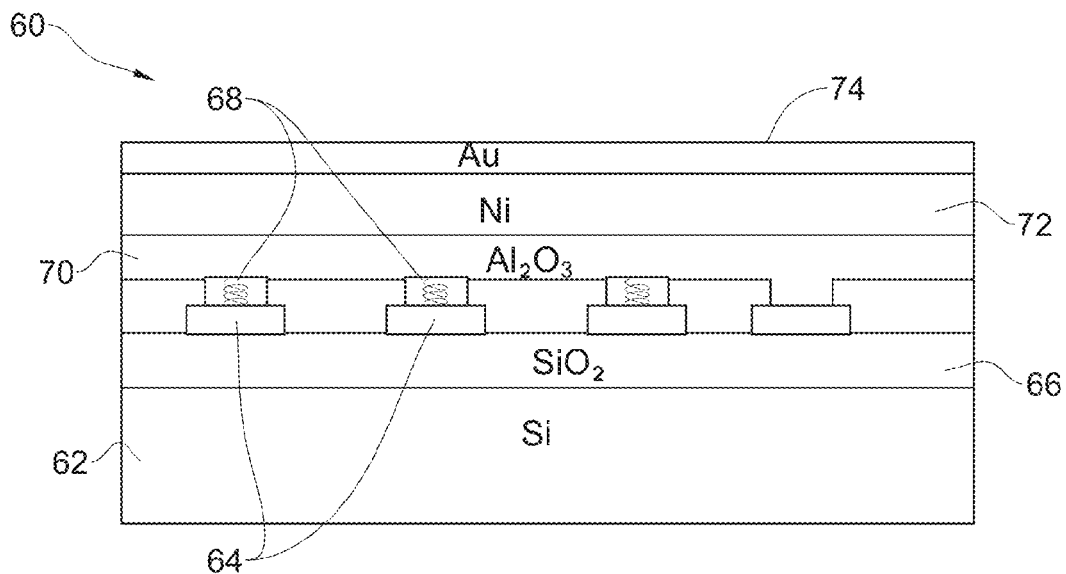
FIG. 4 illustrates a side view of a memory device, in accordance with an exemplary embodiment of the present technique.
Figure 5:
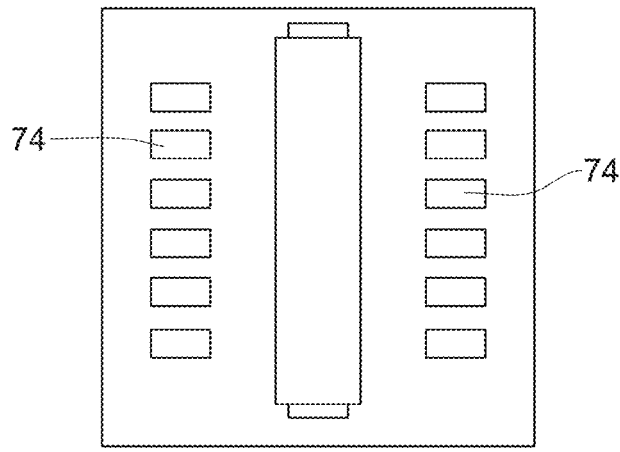
FIG. 5 illustrates a top view of the memory device of FIG. 4, in accordance with an exemplary embodiment of the present technique.

Accordingly, FIG. 4 is illustrates a side view of another memory device 60, in accordance with an exemplary embodiment of the present technique. Similarly, FIG. 5 illustrates a top view of the device shown in FIG. 4, in accordance with an exemplary embodiment of the present technique. The depicted memory device 60 utilizes chiral molecules, such as those describe above, used in conjunction with CISS effect for effecting spin filters in magnetizing a free ferromagnetic layer along a desired direction. The device 60 may be fabricated to attain micron size scales, while utilizing standard very large scale integration (VLSI) methods. Hence, the memory device 60 may be made up of multiple layers, whereby each layer may be adapted to provide certain desired functionalities for operating the device 60.

Accordingly, in an exemplary embodiment, the device 60 is made up of a silicon substrate 62 over which bottom gold (Au) contacts 64 are evaporated. Device 60 further includes a silicone oxide ($SiO_2$) layer 66, which can be grown to a width of 500 nm utilizing, for example, chemical vapor deposition and/or similar methods. The device 60 further includes chiral molecules 68 disposed in 40×50 µm² windows created within sites further disposed within the silicon oxide layer 66. In the illustrated exemplary embodiment, the chiral molecules 64 are made up of polyalanin, however, other embodiments of the present technique may include chiral molecules made up of various materials, such as but not limited to synthetic DNA molecules or other helical molecules, such as those found in certain nucleic acids, peptides, helicenes, polythiophene, and the like.

The device 60 further includes an aluminum oxide layer ($Al_2O_3$) 70, which can be evaporated on the layer 66. In the illustrated exemplary embodiment, aluminum oxide layer 70 is one nano-meter thick, and is adapted to serve as a tunnel barrier. The memory device 60 further includes a 20 nm ferromagnetic nickel (Ni) layer 72, which can be evaporated on the layer 70. Layer 72 is adapted to serve as the free ferromagnetic layer adapted for being magnetized in accordance with received spin-filtered electrons having a particular spin polarization aligned along a preferred direction. In addition, the device 60 includes a top layer 74 made up of gold (Au), evaporated on top of the Ni layer 74. Gold layer 74 is adapted to provide contacts (see top view FIG. 5) for establishing electrical currents within the device 60 for writing data on or reading data from the device 60.

Hence, the memory device 60 can be written to store single or multiple data bits in a manner similar to that described with reference to the memory device 40, as illustrated in FIG. 3. Thus, while establishing a current between silicon substrate 62 and gold contacts 74, electrons ejected from bottom gold layer 64 transfer through chiral polyalanin layer 68 and Ni layer. Due to the CISS effect, as effectuate by the chiral molecules 68, the electrons entering the ferromagnetic layer 70 are spin polarized in accordance with the chirality of the molecules and the direction of the electrical current existing between the silicon layer 62 and gold contacts 74. For instance, in a case where the spin of the electron is oriented mainly anti-parallel to its velocity, such electrons entering nickel layer 72 transfer spin torque to layer 72, thereby causing magnetization of the layer 72. In so doing, resistivity of the magnetized layer 72 increases. This increase in resistivity can be measured (as would be performed in a reading operation) for indicating the particular magnetization attained by the layer 72.

As further illustrated, hybrid layer forming chiral molecules (e.g., molecules 68) is made up of sites disposed throughout a length of the device 60. Accordingly, in preparing the hybrid layer forming chiral molecules 68, device 60 is immersed in absolute ethanol for 20 min before being immersed into a 1 mM ethanol solution including the organic molecules 68 overnight. This procedure allows for the self-assembled molecules to form a homogeneous, closely packed single layer of molecules. Thereafter, the excess of organic molecules is removed by washing several times device 60 with ethanol. Finally, device 60 is dried using nitrogen. The aforementioned process was performed under an inert atmosphere.

Hence, those skilled in the art will appreciate the above fabrication process facilitates the placement of chiral molecules 68 along various sites within device 60, whereby each site may include chiral molecules oriented along a preferred direction, i.e., right handed, or left handed, as may be desired. In so doing, the device 60 is adapted to store multiple digital bits, which can be written onto Ni layer 72 when a current passes through each of sites 68 for determining the spin polarization of regions disposed along the layer 72. Thus, in an exemplary embodiment of the present technique, a first site of the layer 68 can be chosen to have a specific chirality such that when current passes through that site, the portion of Ni layer 72 overlaying the first site will attain a spin magnetization (as achieved through the CISS and STT) along a specified direction, say +1. Similarly, a second site within layer 68 can be chosen to have molecules of different chirality such that passing a current therethrough will achieve a magnetization of layer 72 opposite (i.e., −1) the magnetization produced by the first site in layer.

While the aforementioned magnetization states can be used to store two different memory bits, such as those generally used for storing digital data bits, i.e., 0,1, the device 60 can further be used to attain a third state of magnetization, achieved when the above two states of magnetization of Ni layer 72 are combined to achieve a state of no net magnetization, i.e., 0, of the layer 72. Hence, those skilled in the art will appreciate that the three states of magnetization, i.e., +1, −1, and 0, as attained by the ferromagnetic layer 72, enable the device 60 to operate as a logic gate, such as a XOR, such as one generally used in standard computer logic. Furthermore, digital bits stored on the device 60 can be read from the device 60 by establishing electrical currents between silicon layer 62 and gold layer 74. Such electrical currents can be used to measure the electrical resistivity along the device 60 for determining the spin polarization along ferromagnetic layer 72. In accordance with the present technique, if the Ni layer 72 is spin polarized in the same direction as the spin transferred thereon by the electrons passing through chiral layer 68, the measured resistivity will relatively high to when the spin polarization of the ferromagnetic layer is directed opposite to that of the transferred spin. Hence, such resistivity measurements determine the state of polarization of Ni layer 72 and, therefore, provide a reading of stored data bit, i.e., 0 or 1, stored on the device 60.

Figure 6:
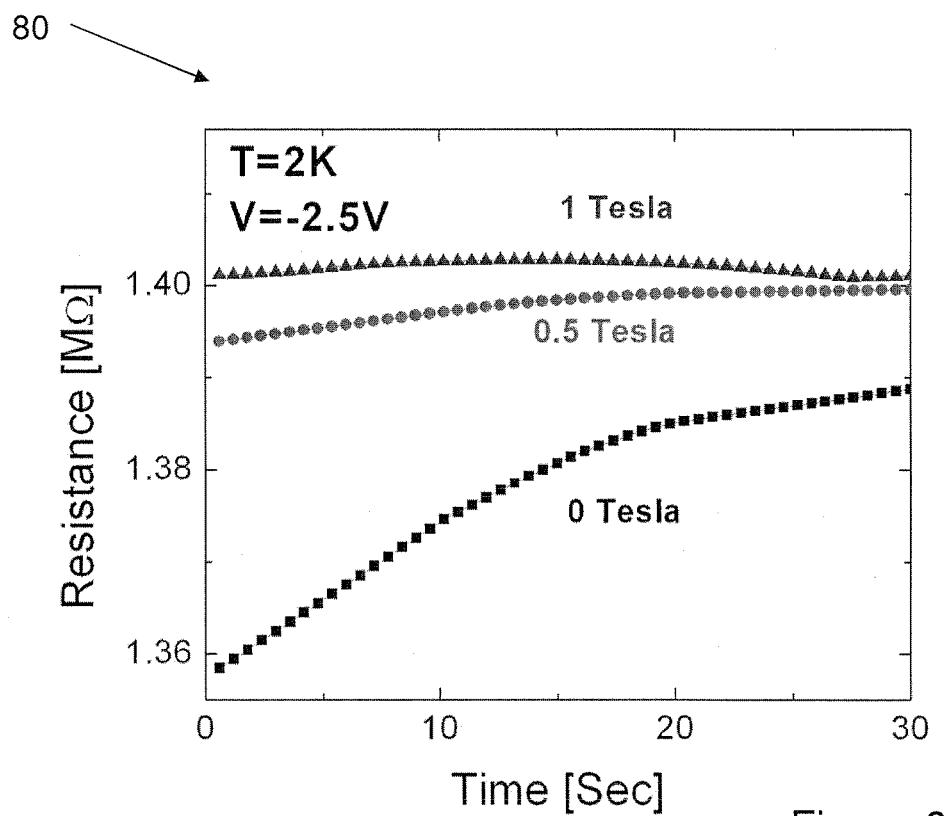
FIG. 6 illustrates a graph associated with the device shown in FIG. 4, in accordance with an embodiment of the present technique.

FIG. 6 illustrates a graph 80 associated with the device shown in FIGS. 4 and 5, in accordance with an embodiment of the present technique. Curve 80, as illustrated by FIG. 6 presents the magnetization of nickel layer 72 of device 60 without a presence of an external magnetic field. For an applied constant voltage of −2.5V across the device, graph 80 illustrates that resistance is increasing with time until a maximum value is reached. Hence, the change in the resistance is a result of magnetization effected throughout the layer 72 of device 60. For a 20 nm thick Ni layer 72, demagnetization occurs relatively fast, while showing a strong dependence on temperature. As further illustrated by additional curves of graph 80 that when external magnetic fields (0.5 T and 1 T) are applied to the device 60, the overall measured resistance increases, further providing for evidence of for the magnetization occurring within layer 72. Hence, for a field having a magnitude 0.5 T, i.e., a field just below the saturation field required for magnetizing the Ni layer 72, the sets of voltage vs. current measurements are compared. The comparisons are performed when device 60 is rotated relative to the applied field such that a long axis of the chiral molecules is aligned parallel to the field (e.g., field relative to device 0°), whereby electrons flow from gold layer 64 to the nickel layer 72.

In such a configuration, measured resistance will increase as seen by FIG. 6. However, if the flow of electrons is directed opposite to that described above (e.g., field relative to device 180°), the magnetization of within nickel layer 72 would be opposite to the spin transferred by electrons traversing the chiral molecule, in which case spin injected into the nickel layer 72 are minority of carriers, thereby providing a lower resistance measurement. Further, when the axis of the molecule is perpendicular to the magnetic field (90° at our notations) spins with equal probability of being parallel or anti parallel to the magnetic field are injected.

Figure 7:
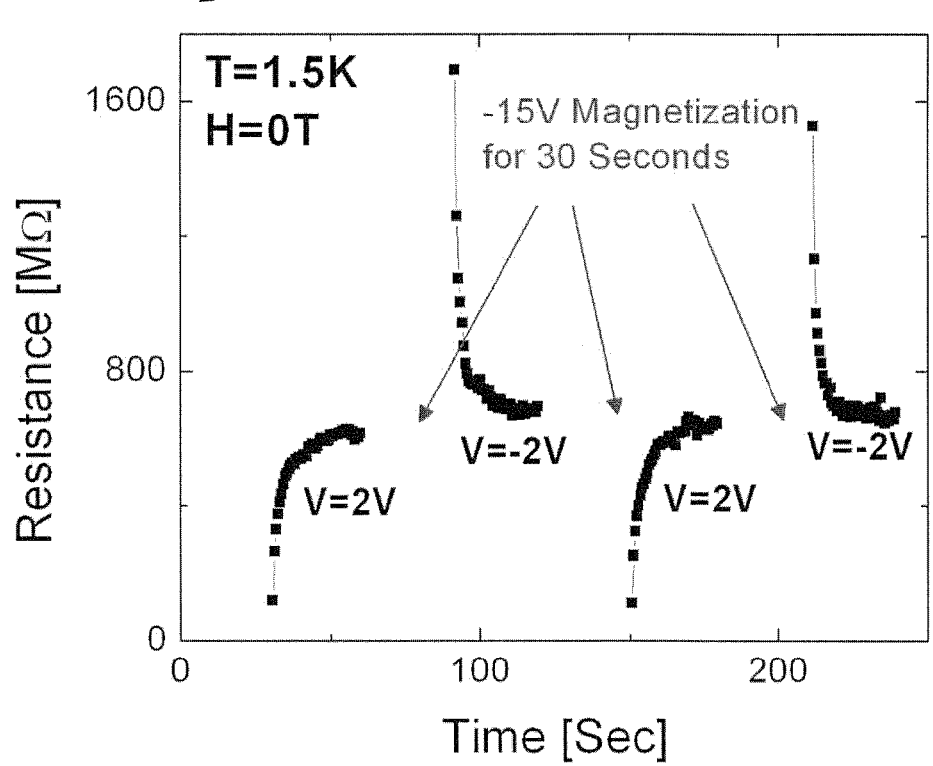
FIG. 7 illustrates another graph associated with the device shown in FIGS. 4 and 5, in accordance with an embodiment of the present technique.

FIG. 7 illustrates another graph 90 associated with the device 60 shown in FIGS. 4 and 5, in accordance with an embodiment of the present technique. The figure illustrates a memory effect, as achieved by device 60. Particularly, writing on the device is achieved via magnetization of the Ni layer at −15V, while reading of the device is achieved using lower voltages, such as −2V or +2 V. For 2V spin transfer of minority carriers is initially occurring such that a low resistance is initially measured which increase with time. In case reading using −2V, an initial high resistance is measured in which majority of spins are injected. Hence, such writing onto or reading from the device 60 is repeatable with significant difference in resistance measurement (at least one order of magnitude) between the −2V resistance measurement and the +2V resistance measurement during the first second of observation.

Figure 8:
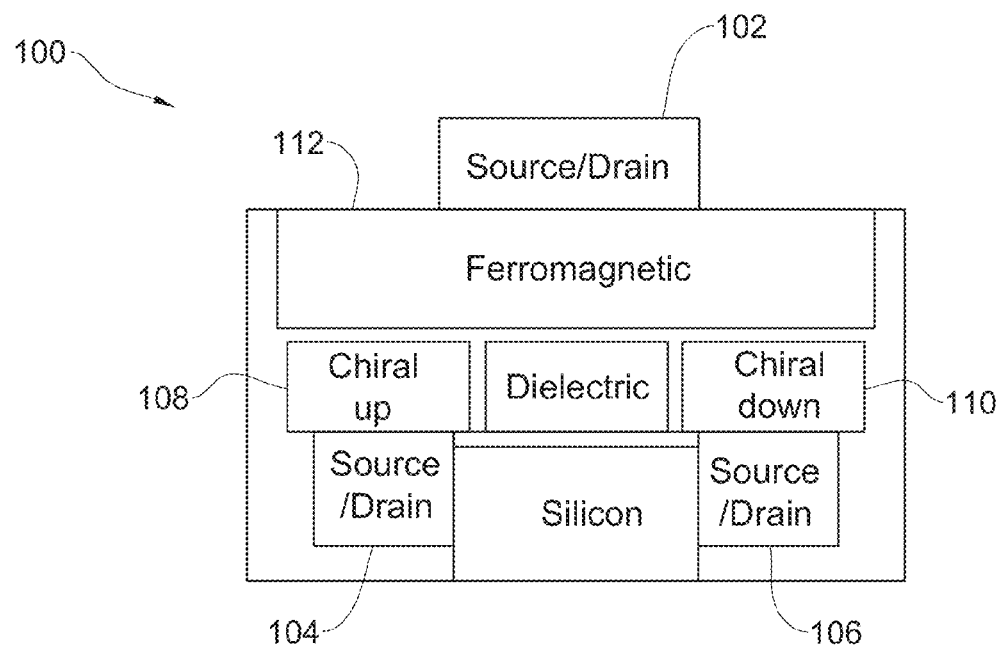
FIG. 8 illustrates a side view of a mask plan of a memory device, in accordance with an embodiment of the present technique.

FIG. 8 illustrates a side view of a mask of a memory device 100, in accordance with an embodiment of the present technique. Accordingly, the mask plan may be that of the memory device illustrated by FIGS. 4 and 5, or a similar device employing the principles methods discussed above for implementing memory devices utilizing chiral molecules the CISS effect. Hence, the mask 100 may be that of silicon based devices illustrating components of various VLSI layers and their functionalities. As illustrated by FIG. 8, the memory device includes a top silicon layer 102 including a source/drain component, as well as bottom silicon layer having sources/drains 104 and 106. The top and bottom source/drain components 102-106, respectively, are adapted for setting up electrical currents through the memory device 100, so that data may be written on or read from the device 100. Disposed between the bottom and top source/drain layers is a dielectric layer including a first plurality of chiral molecules 108 and a second plurality of chiral molecules 110. In the illustrated exemplary embodiment, the chirality of molecules 108 is arranged opposite that of molecules 110. Hence, it should be borne in mind that the illustrated plan 100 merely shows an exemplary nano-size memory cell for storing single bits of data, however, the present technique contemplates scaling up such mask plans so as to facilitate fabrication of much larger devices adapted for storing and/or manipulating very large number of bits, as would be used in modern memory and logic devices. Accordingly, such devices may employ numerous if not millions and millions of replications of the device as illustrated by FIG. 8.

As further illustrated, the device 100 includes a ferromagnetic layer 112 adapted to be magnetized by spin filtered electrons, whose spin may be imparted onto the layer 112 for writing data bits to the device 100. Thus, for example, in operation, electrical currents may be set up between source/drain 104 and source/drain 102 so that electrons may travel upward through the chiral molecules 108 for magnetizing the layer 112 along a direction, as prescribed by the handedness of chiral molecule layer 108. A similar current between source/drain 106 and source drain 102 may be set up such that chiral molecules 110 can filter spin of electrons to produce a magnetization of the layer 112 that would be opposite from that produced by the molecules 108. Yet, in another mode of writing, both sources drains 104 and 106 may be used to drive a current through the device 100 such that the ferromagnetic layer 102 would gain no net magnetization. Again, the above three states of magnetization may be denoted as +1, −1, and 0, respectively, of the layer 12, provides the device 100 with logic based operability, for example, such as one employed by a XOR gate.

Once the device 100 is written to store bits, that is, where the ferromagnetic layer is magnetized along preferred directions, such bits may be read and retrieved at a later time. Such reading operations of the device 100 may be performed by passing currents between the sources/drains 104 and 106 and source drain 102 so that resistivity of the ferromagnetic layer 112 can be measured to provide an indication of the state of magnetization of that layer. Thus, each of the states of magnetization corresponding to the above labels +1, −1, and 0, would provide a distinct resistance measurement of the layer 112, thereby enabling reading the bits stored on the device 100. It should be noted that in accordance with the present technique, the magnitude of current used for reading the device 100 is significantly lower than that used for writing data on the device 100.

Figure 9:
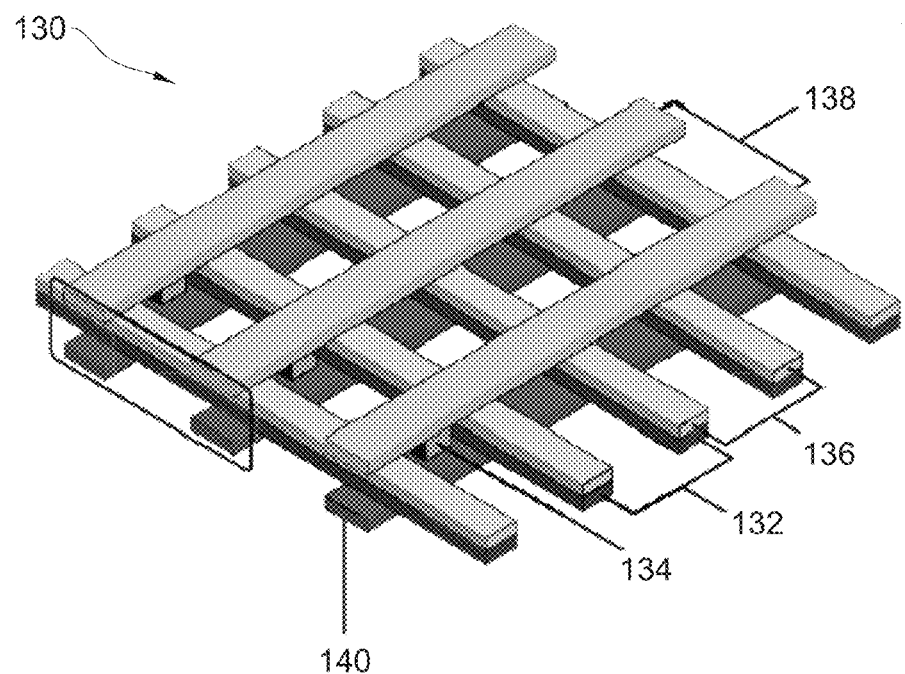
FIG. 9 is a perspective view of a memory device, is implemented in an integrated circuit (IC), in accordance with an embodiment of the present technique.

FIG. 9 is a perspective view of a nano-metric array configuration of a memory device 130, as implemented in an integrated circuit (IC), in accordance with an embodiment of the present technique. Accordingly, the device 130 is made up of a plurality of storage elements 132, such as those described with reference to FIG. 8. The device 130 further includes source/contacts points 134, word lines 136, metal lines 138, and bit lines 140. Hence, those skilled in the art will appreciate that the array of the disclosed configuration is adapted to perform timing of voltages applied along contact points 134-140 in writing data on and/or reading data from the device 130. Furthermore, when operating as a logic-based device, the array forming the device 130 can realize a XOR logic device, such that when driving current through the two leads the magnetization is 0, while driving current through one of the leads the ferromagnetic layer becomes magnetized. Accordingly, device 130 may include multiple memory and logic elements (such as those described above by FIGS. 1-8), and is adapted to be coupled to larger memory and/or logic device, as well as be integrated and/or be part of computer processing elements and/or storage devices, such as those used in modern day computing and data storage systems, respectively.

Figure 10:
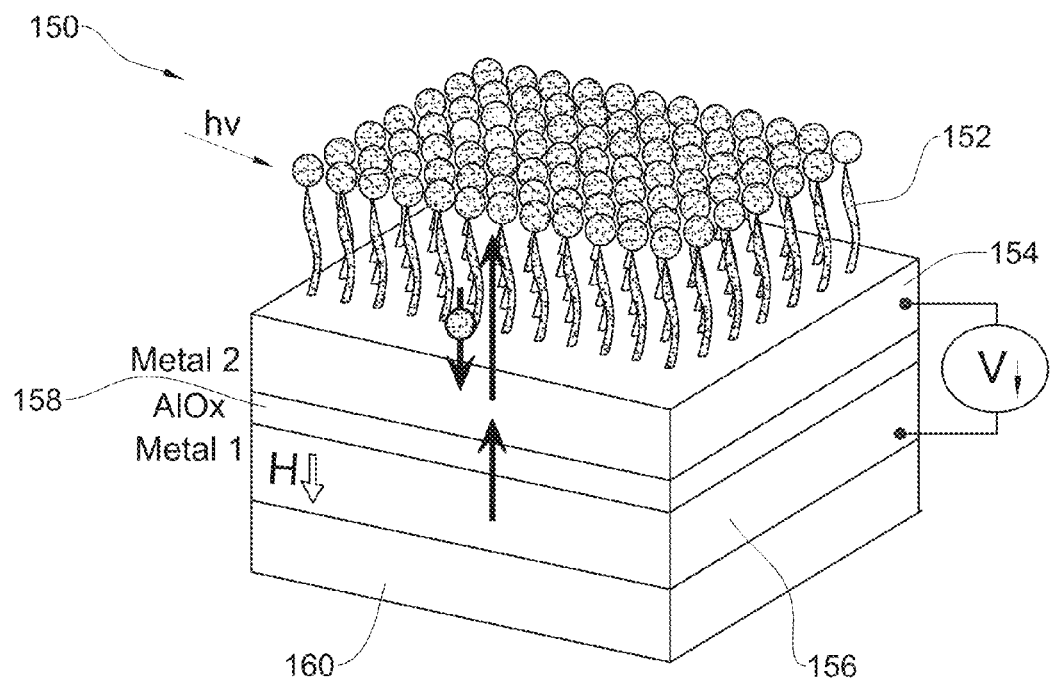
FIG. 10 illustrates a device 150 adapted to be part of a memory reader, in accordance with an embodiment of the present technique.

FIG. 10 illustrates a device 150 adapted to be part of a memory reader, in accordance with an embodiment of the present technique. Spintronic device 150 employs photo-excitation together with chiral molecules and the CISS effect for determining spin polarization of a free magnetic layer. Such magnetic layer may include nano-particles, whose size may be on the order of 50 nm or, alternatively, the magnetic layer may be made up of ferromagnetic thin films or other suitable ferromagnetic materials. As further illustrated, the device 150 includes a top layer of chiral DNA molecules 152 forming a self assembled layer on a metal layer 154, such as but not limited to silver (Ag). The chiral molecules are bound to the surface of the layer 154 through a thiol group, whereas a dye molecule (Cy3) is attached to the other (top) end of the chiral molecules 152. The device 150 further includes a bottom ferromagnetic layer 156, such as nickel (Ni), over which a layer of aluminum oxide 158 is disposed. The device 150 may be applied to a memory device, such as hard disk, illustrated by FIG. 10 as layer 160. Accordingly, the layer 160 may be made up of magnetic material having a prescribed spin magnetization throughout one or more of its regions.

In operation, the device 150 is excitable by coherent electromagnetic radiation generated, for example, a by blue (419 nm, 100 µW) CW laser, or by a green (532 nm, 3.5 µW) CW laser, both of which may be chopped at a prescribed frequency, e.g., 137 Hz. Hence, upon photo-excitation of the dye molecules, electron-hole pairs are formed within the molecules 152, whereby holes transfer from dye molecules 152 to silver substrate 154. This transfer of holes can be indicated by a positive voltage, measured between silver film 154 the grounded nickel layer film 156. The hole transfer is, in turn, indicative of electrons transferring from silver substrate 154 to the photo-excited dye 152, as achieved through a highest occupied molecular orbital (HOMO) of the DNA molecules 152. Hence, in accordance with the CISS effect, those electrons transported more easily through the DNA molecule 152, those having their spin directed antiparallel to their momentum) molecules 152, ultimately cause silver layer 154 to become positively charged with a spin specific hole.

In accordance with the illustrated embodiment of FIG. 10, the application of the device 150 to a magnetic device, such as the hard disc 160, can cause the magnetic moment of the Ni layer 156 (white arrow pointing downward) to be aligned anti-parallel to the velocity of electron spin transported from the silver layer 154 to the dye through the chiral molecules 152. This is further illustrated by FIG. 11, as electrons from just underneath the Fermi energy in the Ni layer 156 are injected into the silver layer 154, thereby causing that layer to be neutralized. Thus, subsequent to holes transferring from the dye 152 to the silver layer 154, an electron transfer from the excited dye 152 (i.e., after its hole has been filled also occurs, thereby completely neutralizing layer 152 within a characteristic time (typically sub-nanosecond), so as to return dye 152 to its original initial state. However, because the electron transfer rate from the silver layer 154 to the dye 152 (or the hole transfer rate from the dye to the silver) is greater than the back transfer rate, a constant illumination of the dye 152 produces a steady state of charge on the silver layer 154, as would be indicated by a positive voltage reading, taken elative to nickel layer 156, which in the illustrated embodiment is maintained grounded. Accordingly, the amount of charge transferred can be estimated based on the resistance of the $AlO_x$ layer 158, typically around 1 kΩ, that is, without an application of an external magnetic field. Typical voltages may be measured to be approximately 1 µV, when using a laser (e.g., wavelength 532 nm) operated at 3.5 µW. Such voltages are indicative of approximately $6.3 \times 10^9$ electrons/sec transferred from the silver layer 154 to the dye molecules 152. Further, in an exemplary embodiment of the present technique, the device 150 may employ layer 152 to have a density of about $\sim 10^{13}$ molecules/$cm^2$. Hence, with a device, such as the device 150, having a surface area of $10^{-8}$ $cm^2$, each dye molecule on the surface can obtain an electron at a rate of approximately $6.3 \times 10^4$ times/sec, on average.

Figure 11:
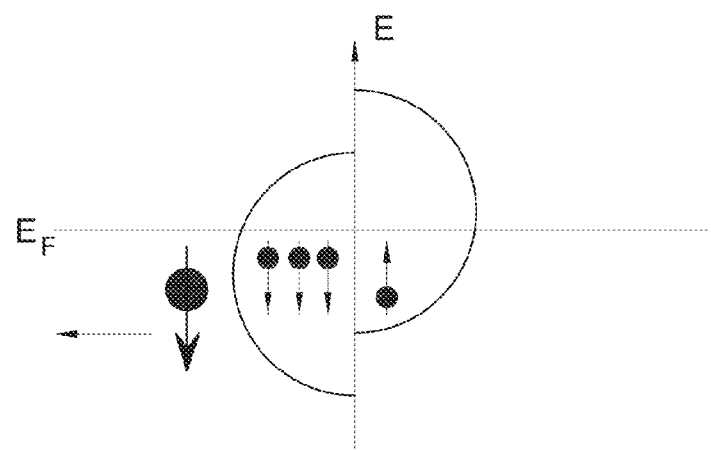
FIG. 11 illustrates an energy diagram associated with the device show in FIG. 10, in accordance with an embodiment of the present technique.
Figure 12:
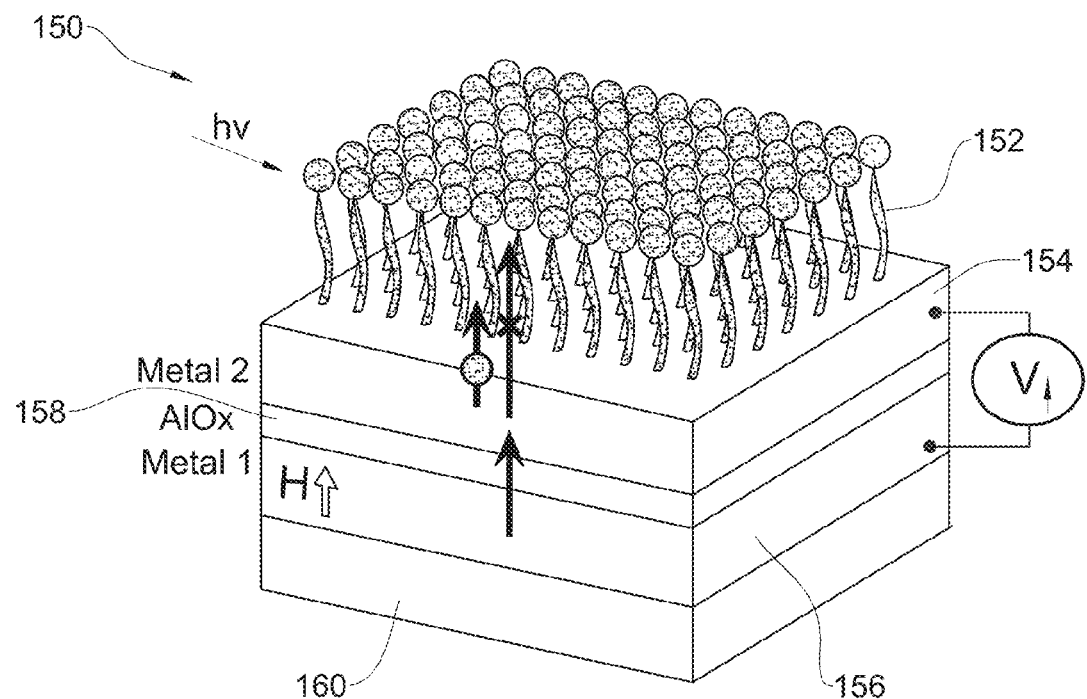
FIG. 12 illustrates another depiction of the device of FIG. 10, in accordance with an embodiment of the present technique.

Further, by contrast, in accordance with the illustrated embodiment of FIG. 12, the application of the device 150 to a magnetic device, such as the hard disc 160, where the magnetic moment of the Ni layer 156 (white arrow pointing upward) is aligned parallel to the velocity of the spin transferred from silver layer 154 to the dye through chiral molecules 152. Hence, in such an arrangement where the Ni layer 156 becomes polarized in an opposite direction (i.e., opposite to the direction illustrated by FIG. 10), few electrons, with spins properly oriented, are available for filling vacancies in the spin specific holes produced in the silver layer 154, as may result from the illumination of device 150. Thus, a lower voltage will be measured between the layers 154 and 156, as compared with the configuration illustrated in FIG. 10 where a higher voltage between the aforementioned layers exists. This is further illustrated by FIG. 13, as the number of electrons from just underneath the Fermi energy in the Ni layer 156 to be injected into the silver layer 154, are fewer in number than those available for the opposite configuration, i.e., FIGS. 10 and 11.

Hence, the two states of polarization attained by the device 150, as illustrated by the FIGS. 10 and 12, respectively, may provide distinct and separate voltage readings for indicating a state of polarization of layer 156 which, in turn, may provide a reading of a magnetic device, such as a memory hard disk 160. Hence, a spin polarization, P, for the device 150 can be defined as: $P=V_\uparrow-V_\downarrow/V_{\uparrow\downarrow}$, where $V_{\uparrow\downarrow}$ indicates a voltage where no external magnetic field is applied, such that it represents the voltage when both spins can be injected from the Ni layer 156, that is, when no magnetization is applied to the Ni layer 156. Thus, if a magnetic field is applied so at to polarize the Ni layer 156, the voltage measured between silver layer 154 and nickel layer 156 varies in accordance with the direction of the applied magnetic field. Accordingly, if the magnetic moment of the Ni layer 156 points toward the organic layer, i.e., layer 152, then voltage $V_\uparrow>V_\downarrow$ (where $V_\downarrow$ or $V_\uparrow$ correspond to the voltage generated between the layers 154 and 156 where the magnetization of the Ni layer 156 points into or out of the plane, as indicated in FIGS. 10 and 12, respectively). Thus, the higher voltage measured for magnetic field aligned parallel to the electrons' momentum indicates that the spin of the electrons transferred through the molecules 152 from the silver layer 154 are aligned antiparallel to their velocity.

Figure 14:
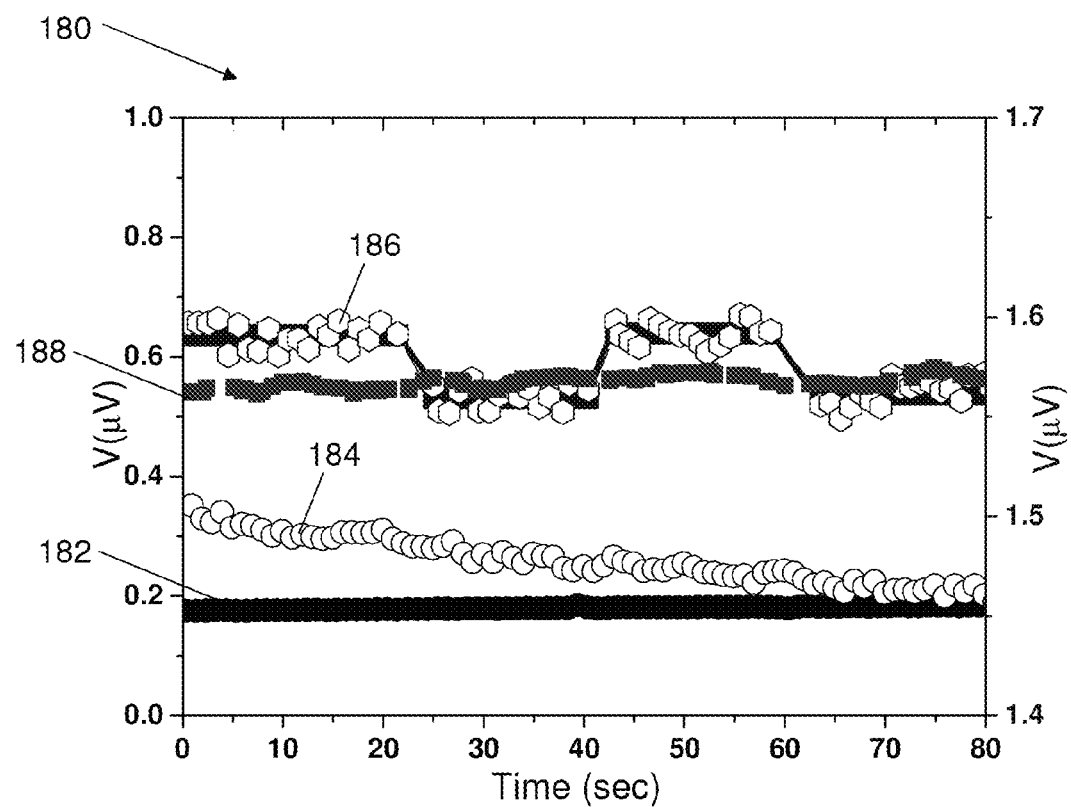
FIG. 14 illustrates a graph showing plots of voltages vs. time associated with the device illustrated in FIGS. 10 and 12, in accordance with an embodiment of the present technique.

FIGS. 14-18 illustrate various plots associated with the devices illustrated in FIGS. 10 and 12, in accordance with an exemplary embodiment of the present technique. Accordingly, FIG. 14 illustrates graph 180 showing voltages measured between the layers (Ag) 154 and (Ni) 156 of device 150. Thus, curve 182 shows a case where the device 150 in the absence of layer 152, that is, where no-dsDNA adsorbed on the device (T=290K; 532 nm laser). Further curve 184 illustrates a case where the device 150 includes the chiral layer 152 having a dsDNA/Cy3 layer adsorbed thereon. Curve 184 is obtained while the device 150 is irradiated by a laser at 635 nm. Further, curve 186 of graph 180 illustrates voltage measured as a function of time for adsorbed dsDNA/Cy3 molecules, i.e., layer 152 of device 150 under illumination at 532 nm. As illustrated by curve 186, the variation of voltage time is due to the magnetic field (0.45 T), directed either towards or away the organic films forming the layer 152. Further, curve 188 illustrates measured voltages between layers 154 and 156 of the device 150 when the molecules forming the layer 152 are adsorbed and illuminated at 532 nm with no applied magnetic field.

Figure 13:
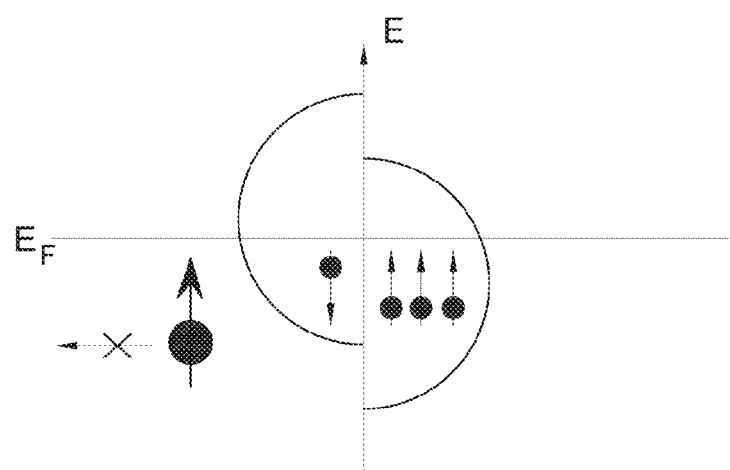
FIG. 13 illustrates an energy diagram associated with the device show in FIG. 12, in accordance with an embodiment of the present technique.
Figure 15:
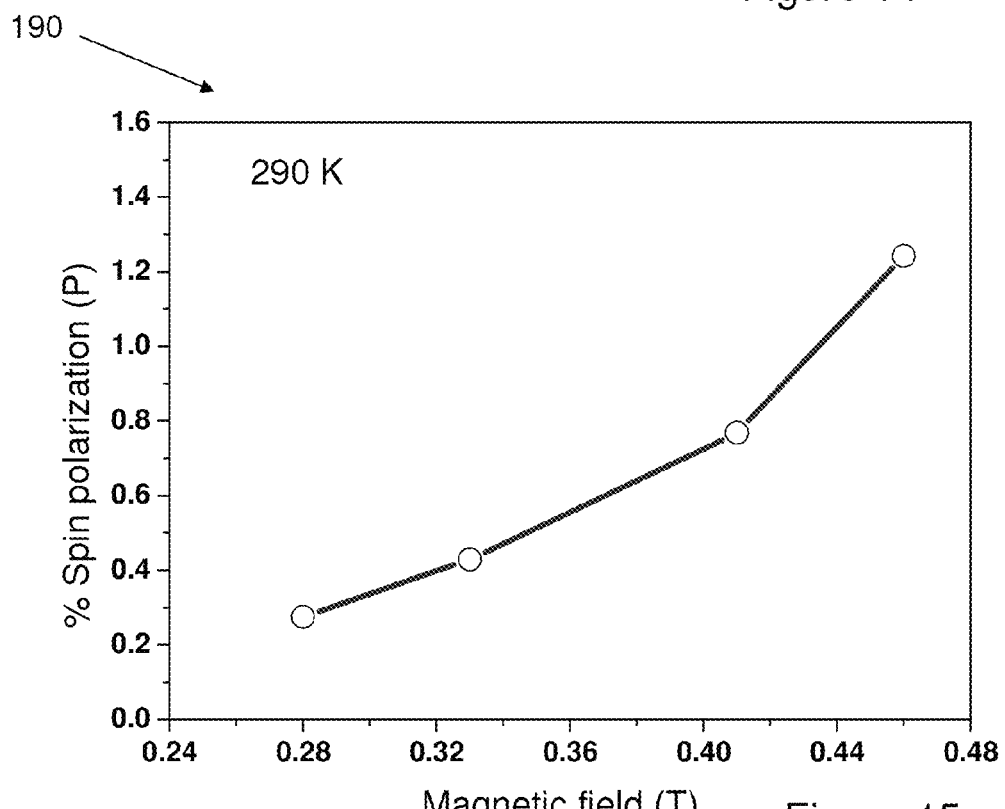
FIG. 15 illustrates a graph showing plot of spin polarization vs. magnetic field strength associated with the device illustrated in FIGS. 10 and 12, in accordance with an embodiment of the present technique.

In accordance with the present technique, FIG. 15 illustrates plot 190 showing spin polarization P measured as a function of magnetic field strength H. As is clearly illustrated by plot 190, an increase in P is correlated with increases of the magnetic field strength. Such increase reflects the relative changes in the ratio between the majority versus minority spins density of states just below the Fermi level, as illustrated by FIGS. 11 and 13, respectively. Thus, as the magnetic field increases, so does the ratio between the aforementioned spin states.

Figure 16:
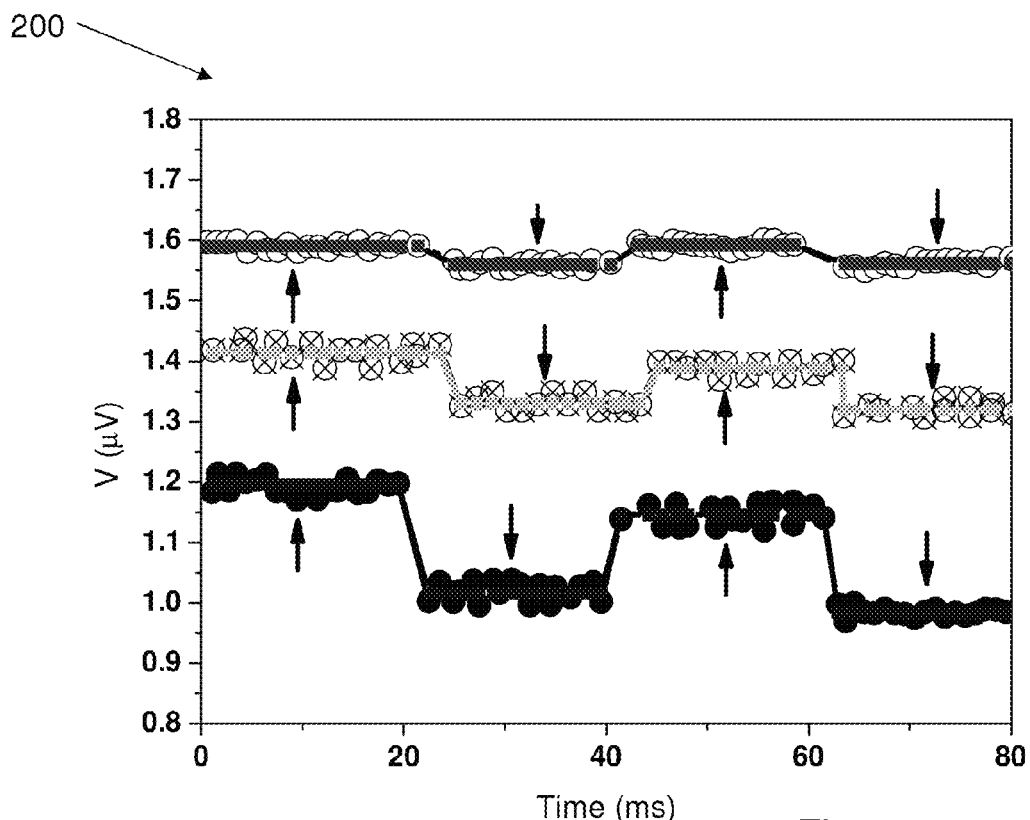
FIG. 16 illustrates another graph showing plots of voltage vs. time associated with the device illustrated in FIGS. 10 and 12, in accordance with an embodiment of the present technique.
Figure 17:
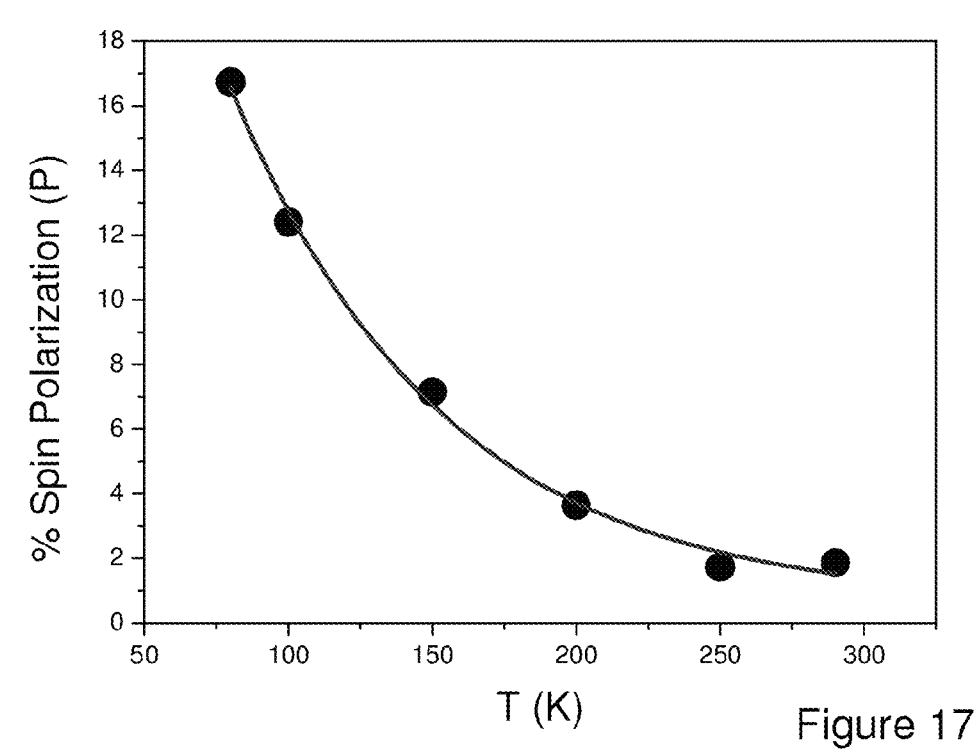
FIG. 17 illustrates another graph showing plot of spin polarization vs. magnetic field strength associated with the device illustrated in FIGS. 10 and 12, in accordance with an embodiment of the present technique.

Further, FIG. 16 illustrates graph 200, further illustrating time profiles of the voltage between silver layer 154 and nickel layer 156, where magnetic fields are applied directed either towards or away from (e.g., as shown by black arrows) the organic chiral layer 152, taken at 290 K and 80K. FIG. 17 illustrates plot 210, generally showing the manner by which P depends on temperature.

Figure 18:
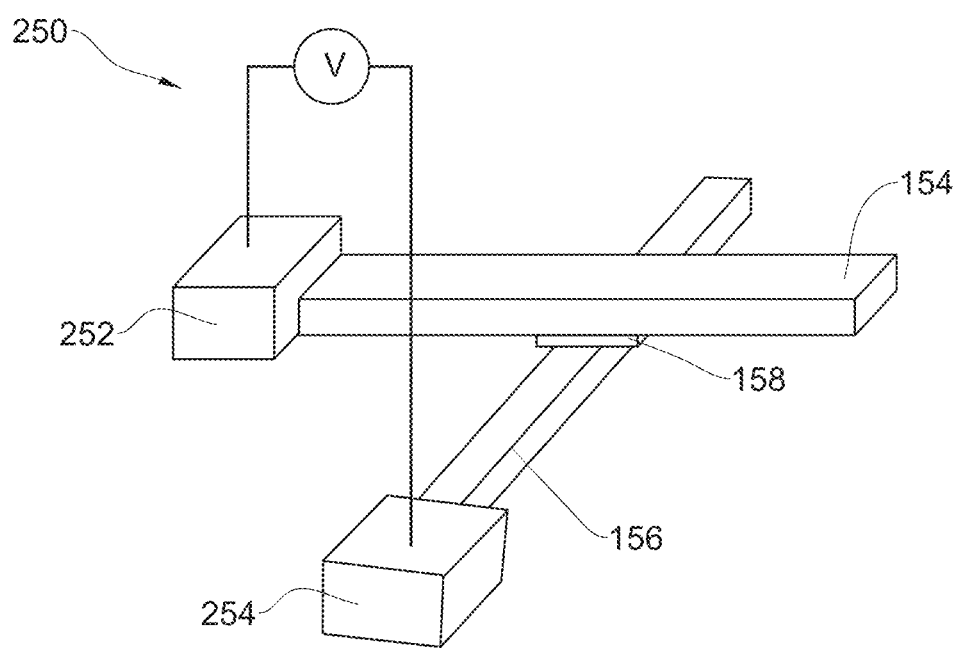
FIG. 18 illustrates a physical structure associated with the devices shown in FIGS. 10 and 12, in accordance with an embodiment of the present technique.

FIG. 18 illustrates a physical structure 250 associated with the devices shown in FIGS. 10 and 12, in accordance with an embodiment of the present technique. The structure 250 is physical implementation of spintronic based device such as, for example, the memory reading device 150, illustrated by FIGS. 10 and 12. Further, the structure 250 may be sized to micron scales and fabricated in accordance with VLSI methods. Hence, the structure illustrates gold contact 252 coupled to silver layer 154, as well as gold contact and 254 coupled to nickel layer 254. The gold contacts 252 and 254 are adapted to provide capabilities for measuring voltages between the layers 252 and 254 for determining the spin polarization of Ni layer 156, as illustrated in FIGS. 10 and 12.

The device forming structure 250 can be prepared by photolithography followed by e-beam evaporation on a silicon (<100>, 400Ω per $cm^2$) substrate. In accordance with the present technique, a 1-μm wide 1-mm long, and 150-nm-thick Ni line 156 is evaporated on a 5-nm Ti adhesion layer. The AlOx layer 158 with a thickness of about 0.5 nm is deposited by atomic layer deposition. Top 50-nm-thick perpendicular Ag line 154 is evaporated without any adhesion layer. Further, gold contacts 252 and 254 are fabricated for wire-bonding and are 150 nm in thickness.

The invention claimed is:

1. A device for selecting spin, comprising:
a first layer comprising a ferromagnetic material; and
a second layer coupled to the first layer, wherein the second layer comprises at least one molecule having a specified chirality, such that when electrical current flows between the first layer and the second layer one or more regions of the ferromagnetic material become magnetically polarized along a certain direction; the direction of the magnetically polarized regions of the one or more regions comprises writable data that is storable on the device.

2. The device of claim 1, wherein the data bit stored on the device can be read from the device by passing a current between the first and second layer.

3. The device of claim 2, wherein the current used for reading the data bit from the spin device is substantially lower than the current used for magnetically polarizing the one or more regions of the ferromagnetic layer.

4. The device of claim 1, wherein the ferromagnetic layer comprises nano-particles.

5. The device of claim 1, wherein the second layer comprises chiral molecules having one specific handedness.

6. The device of claim 5, wherein the second layer comprises a self-assembly monolayer (SAM) comprising polypeptides, or proteins, or DNA, or PNA, or helicenes, or chiral conductive polymers or a combination thereof.

7. The device of claim 1, wherein the spin polarization of the one or more regions of the ferromagnetic layer can be determined by measuring resistance existing of the first layer.

8. The device of claim 1, wherein the first and second layers are integrated within a silicon-based device that is fabricated utilizing very large scale integration (VLSI) or ultra large scale integration (ULSI).

9. The device of claim 1, wherein the silicon-based device comprises at least two layers operating as a source and/or a drain, such that the first layer and second layer are disposed between the at least two layers operating as a source and/or a drain.

10. The device of claim 1, comprising a metal layer coupled to the second layer, wherein a voltage is created between the metal layer and the first layer when the device is applied to a memory unit, and wherein a value of the voltage is adapted to provide an indication on a state of magnetization of one or more regions of the memory unit, said device being therefore configured and operable for reading data stored in the memory unit.

11. The device of claim 1, wherein the current between the first and second layers is created in response to electromagnetic illumination.

12. A memory device comprising the device of claim 1.

13. A logic cell, comprising the device of claim 1, wherein the second layer comprises a plurality of the molecules of specific chirality, said plurality of molecules comprising a first specified chirality and a second specified chirality, and wherein each of the specified chiralities is adapted to determine spin polarization of one or more regions of the ferromagnetic material when an electrical current flows between the first layer and the second layer.

14. A logic cell, comprising:
a first layer comprising a ferromagnetic material; and
a second layer coupled to the first layer, wherein the second layer comprises a plurality of molecules comprising a first specified chirality and a second specified chirality, and wherein each of the specified chiralities is adapted to determine spin polarization of one or more regions of the ferromagnetic material when an electrical current flows between the first layer and the second layer.

15. The logic cell of claim 14, comprising: a first state of the spin polarization of the one or more regions of the ferromagnetic layer when the current flows through a region comprising the plurality of molecules comprising the first chirality; a second state of the spin polarization of the one or more regions of the ferromagnetic layer when the current flows through a region comprising the plurality of molecules comprising the second chirality; and a third state of the spin polarization of the one or more regions of the ferromagnetic layer when the current flows through a region comprising the plurality of molecules comprising the first and second chiralities.

16. The logic cell of claim 14, wherein the states of the spin polarization of the one or more regions of the ferromagnetic layer are adapted to define a XOR logic gate.

17. The logic cell of claim 14, wherein the first and second layer are integrated within a silicon-based device that is fabricated utilizing very large scale integration (VLSI) or ultra large scale integration (ULSI).

18. The logic cell of claim 17, wherein the silicon-based device comprises at least two layers operating as a source and/or a drain, such that the first layer and second layer are disposed between the at least two layers operating as a source and/or a drain.

19. The logic cell of claim 14, wherein the first chirality is left handed and the second chirality is right handed.

20. The logic cell of claim 14, wherein the ferromagnetic layer comprises nano-particles having a size of at least 50 nano-meters.

21. The logic cell of claim 14, wherein the second layer comprises self-assembly monolayer (SAM) comprising polypeptides, or proteins, or DNA, or PNA, or helicenes, or chiral conductive polymers, or a combination thereof.

22. The logic cell of claim 14, wherein the spin polarization of the one or more regions of the ferromagnetic layer can be determined by measuring resistance existing between the first and second layers.

23. The logic cell of claim 14, wherein the logic cell is adapted to be controlled by and/or be part of central computing unit.

24. A method of operating the spin selective device of claim 1, comprising:
receiving an electrical current by the first layer comprising ferromagnetic material; and
receiving the electrical current by the second layer coupled to the first layer, wherein the second layer comprises a plurality of the molecules having a specified chirality, such that when an electrical current flows between the first layer and the second layer one or more regions of the ferromagnetic material become magnetically polarized along a certain direction.

25. The method of claim 24, wherein the direction of the magnetically polarized regions of the one or more regions comprises writable data that is storable on the spin selective device.

26. The method of claim 24, wherein the current between the first and second layer is created in response to electromagnetic illumination.

27. A device for selecting spin, comprising:
a first layer comprising a ferromagnetic material; and
a second layer coupled to the first layer, wherein the second layer comprises at least one molecule having a specified chirality, such that when electrical current flows between the first layer and the second layer one or more regions of the ferromagnetic material become magnetically polarized along a certain direction; wherein the first and second layers are integrated within a silicon-based device that is fabricated utilizing very large scale integration (VLSI) or ultra large scale integration (ULSI).

28. The device of claim 27, wherein the silicon-based device comprises at least two layers operating as a source and/or a drain, such that the first layer and second layer are disposed between the at least two layers operating as a source and/or a drain.

29. A device for selecting spin, comprising:
a first layer comprising a ferromagnetic material;
a second layer coupled to the first layer, wherein the second layer comprises at least one molecule having a specified chirality, such that when electrical current flows between the first layer and the second layer one or more regions of the ferromagnetic material become magnetically polarized along a certain direction; and
a metal layer coupled to the second layer, wherein a voltage is created between the metal layer and the first layer when the device is applied to a memory unit, and wherein a value of the voltage is adapted to provide an indication on a state of magnetization of one or more regions of the memory unit, said device being therefore configured and operable for reading data stored in the memory unit.

30. A device for selecting spin, comprising:
a first layer comprising a ferromagnetic material;
a second layer coupled to the first layer, wherein the second layer comprises at least one molecule having a specified chirality, such that when electrical current flows between the first layer and the second layer one or more regions of the ferromagnetic material become magnetically polarized along a certain direction, wherein the current between the first and second layers is created in response to electromagnetic illumination.

* * * * *